United States Patent
Huang

(10) Patent No.: US 10,461,496 B2
(45) Date of Patent: Oct. 29, 2019

(54) SELF-ALIGNING LASER ASSEMBLY

(71) Applicant: DERMAL PHOTONICS CORPORATION, Middleton, MA (US)

(72) Inventor: Zilong Huang, Malden, MA (US)

(73) Assignee: Dermal Photonics Corporation, Middleton, MA (US)

( * ) Notice: Subject to any disclaimer, the term of this patent is extended or adjusted under 35 U.S.C. 154(b) by 0 days.

(21) Appl. No.: 16/180,162

(22) Filed: Nov. 5, 2018

(65) Prior Publication Data
US 2019/0140420 A1    May 9, 2019

Related U.S. Application Data

(60) Provisional application No. 62/582,486, filed on Nov. 7, 2017.

(51) Int. Cl.
*H01S 5/022* (2006.01)
*H01S 5/062* (2006.01)

(52) U.S. Cl.
CPC ...... *H01S 5/02252* (2013.01); *H01S 5/02268* (2013.01); *H01S 5/06243* (2013.01)

(58) Field of Classification Search
CPC ...... H01S 5/062; H01S 5/022; H01S 5/02268; H01S 3/04; H01S 5/06243
USPC ...................................................... 372/107
See application file for complete search history.

(56) References Cited

U.S. PATENT DOCUMENTS

| | | | |
|---|---|---|---|
| 2,380,829 A | 7/1945 | Eddy | |
| 4,060,309 A * | 11/1977 | Le Noane | G02B 6/3843 385/90 |
| 5,172,390 A * | 12/1992 | Mooradian | G02B 6/4204 372/50.11 |
| 6,709,169 B2 | 3/2004 | Rossi | |
| 7,154,926 B2 | 12/2006 | Kouta et al. | |
| 8,811,439 B2 * | 8/2014 | Bean | H01S 5/02212 372/36 |
| 8,888,830 B2 | 11/2014 | Dunleavy et al. | |
| 8,974,443 B2 | 3/2015 | Dunleavy et al. | |
| D747,800 S | 1/2016 | Dunleavy et al. | |
| 2002/0037142 A1* | 3/2002 | Rossi | G02B 6/4204 385/92 |
| 2005/0069266 A1* | 3/2005 | Kouta | H01S 5/02264 385/92 |
| 2009/0129783 A1* | 5/2009 | Ori | G02B 6/4246 398/136 |
| 2011/0122905 A1* | 5/2011 | Bean | H01S 5/02212 372/36 |
| 2014/0074191 A1 | 3/2014 | Dunleavy et al. | |
| 2014/0074194 A1 | 3/2014 | Dunleavy et al. | |
| 2017/0173360 A1 | 6/2017 | O'Neil et al. | |

OTHER PUBLICATIONS

International Search Report and Written Opinion dated Feb. 8, 2019 issued in corresponding International Application No. PCT/US2018/059139.

* cited by examiner

*Primary Examiner* — Tuan N Nguyen
(74) *Attorney, Agent, or Firm* — Onello & Mello, LLP.

(57) ABSTRACT

A self-aligning laser system that is capable of accurate placement for xyz coordinate and rotational alignment and registration of optical lens or lenses in relation to a laser diode without the need for active alignment. This approach reduces complexity, assembly time and costs without sacrifice to precision of alignment and optical performance.

10 Claims, 8 Drawing Sheets

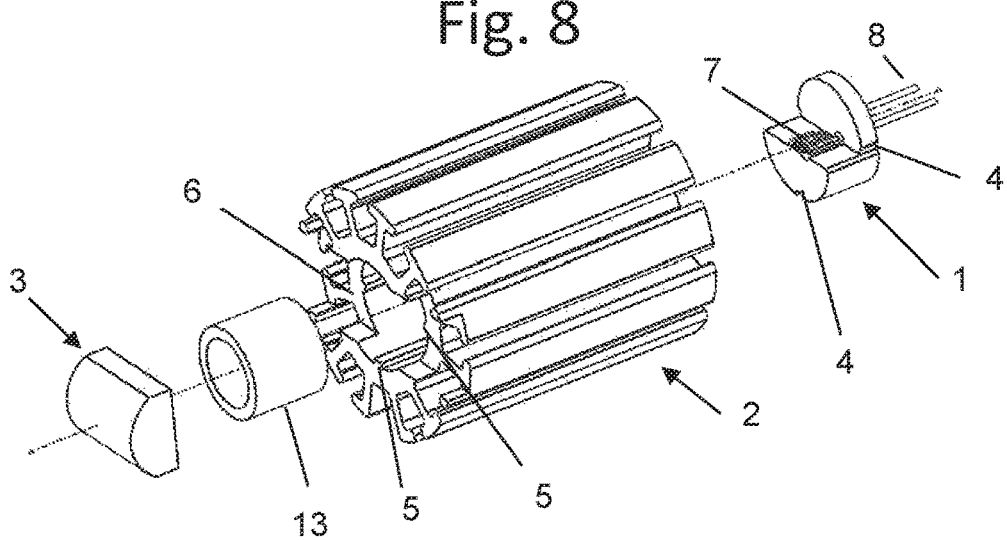
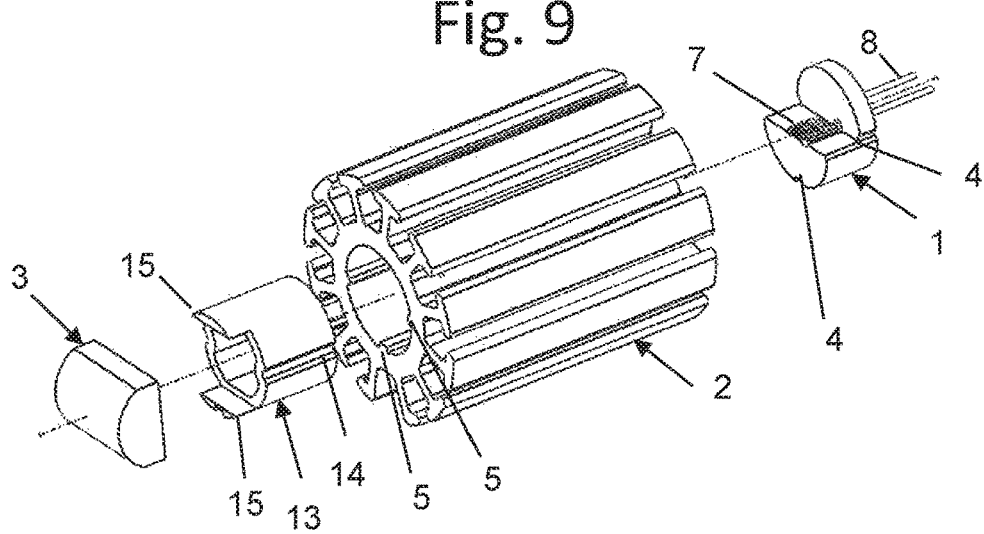
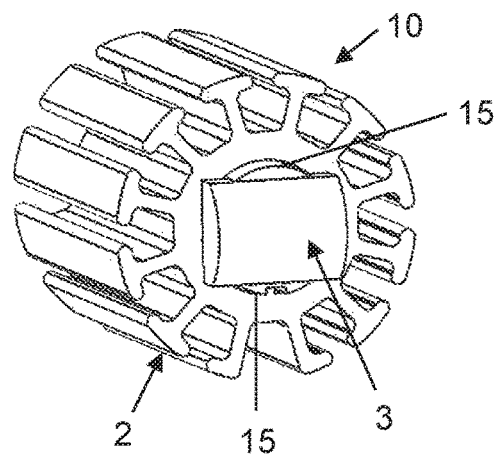

SELF-ALIGNING LASER ASSEMBLY

RELATED APPLICATIONS

This application claims the benefit of U.S. Provisional Application No. 62/582,486, filed Nov. 7, 2017, the content of which is incorporated herein by reference in its entirety.

BACKGROUND

Lasers and other light sources typically require optical elements to modify their optical output to suit a given application. From the earliest days in astronomy in the 1600s, scientists and engineers used round lenses inside a cylindrical tube to precisely mount the lenses on-center in x, y, and z axes, i.e., according to a Cartesian coordinate system or the like. This conventional approach is simple, accurate, and robust and readily transferable to laser systems.

It is common for optics used with lasers to be mounted in precision-machined tubes where the bores may have multiple internal diameters with sharp steps between each internal diameter change to manage the spacing of lenses. These step changes in internal diameter often serve two purposes: 1) to align a given lens radially so that its center matches the center of the optical source as well as other optical elements in the tube and 2) to position the linear distance of the lens precisely in relation to the optical source and other optical elements by having the laser mechanically built-up against the step within the tube. This approach serves the industry well, especially where the optical source divergence is radially symmetric and all corresponding optical elements can similarly be radially symmetric. In U.S. Pat. No. 4,060,309 the contents of which are incorporated herein in their entirety, Noane demonstrates the lens and tube method for alignment of laser optical elements. Prior to this, Eddy implemented this idea in U.S. Pat. No. 2,380,829, the contents of which are incorporated herein in their entirety.

Laser diodes, in particular, semiconductor laser diodes, typically have optical outputs that are not radially symmetric. These laser diodes typically have one divergence angle in the x-axis and a different divergence angle in the y-axis, where the z-axis denotes the path of optical travel. The x-axis is typically denoted with the lower angle of divergence and is often referred to as the "slow axis". The y-axis divergence is typically assigned the higher divergence angle and is often referred to as the "fast axis". Optical assemblies for laser diode systems are often designed to make use of a cylindrical tube for the alignment of lenses; however, care must be taken to mount the laser diode so that its optical emissions are centered within the tube and the optical lenses must be aligned radially to match the positions of the laser diode's fast and slow axes. The laser diode is typically mounted on a TO-can optoelectronics mount apparatus, referred to as "TO-can," or the like, which has a flat surface to mount the laser diode chip and an outer round section to mount within the tubular optical alignment setup. This TO-can arrangement is designed such that the laser diode optical output is centered relative to the outer circular dimension of the TO-can which in-turn mates precisely with the tubular assembly. Typically, a separate lens assembly or the like is used for each of the fast axis and slow axis. However, some applications only lens one of the axes for their application. A single complex toric lens may be used to adjust the fast axis and slow axis using a single lens.

A laser diode assembly is demonstrated by Bean in U.S. Pat. No. 8,811,439, the contents of which are incorporated herein in their entirety, where the outside dimension of the TO-can is mounted within the cylindrical bore of a tube and precisely aligned to a lens also attached to the tube. The TO-can and lens are each inserted into opposite ends of the tube and rest against steps in the tube at each end which precisely determines the z-axis distance between these elements. Bean's laser diode assembly does not exactly describe how the radial alignment is done between the laser diode (mounted on TO-can) and the lens. In particular, no mention is made of radial positioning the TO-can within the tube. Therefore, radial alignment in this setup is still uncertain and may require an active alignment of these elements or precision fixtures during assembly to ensure angular alignment. Such active alignment or precision fixtures and assembly methods add significant cost and complexity to the system and may be prone to misalignment and subsequent performance drawbacks.

SUMMARY

Embodiments of the present inventive concepts include a laser diode or the like mounted on a submount assembly of an optoelectronics apparatus, in particular, a TO-can apparatus or the like. The TO-can has one or more notches or keys in the outer perimeter which correspond to, or mate with, the interior geometry of a tube-shaped heatsink, which may be some or mostly or completely circular but preferably not bored or machined circular, or non-circular, for example, parabolic or other curved configuration. The TO-can is assembled into the tube on one end and one or more lenses are assembled within the tube or at its end. The notches of the TO-can perimeter and the interior of the tubular element mate closely together in at least one radial aspect such that the radial alignment of the TO-can is affixed to the tube as it preferentially allows the TO-can to assemble into the tube to only one precise radial angle, while also accommodating for any irregular cross-sectional shape, for example, different curvatures, partial circular shape, and so on, of the heatsink with which the TO-can and laser diode are assembled. To maintain the radial alignment of the TO-can to a given lens, a slot may be machined across the end of the tube at the correct angle relative to the internal tube mating radial geometry such the lens fits into the slot in one fixed radial angle relative to the angle dictated by the mating geometry for the TO-can assembly. The inside tube geometry dictates the radial mating angles of the TO-can relative to the tube. The interior region, external surface, and/or end geometry of the tube dictates the radial alignment of the lens to the tube. The x-axis and y-axis alignments (relative to the center of the tube) are mutually locked by the mating geometry of the TO-can to the tube. With the radial alignments and x-axis and y-axis alignments mutually locked by aspects of the tube and TO-can geometries, the laser diode x-axis, y-axis and rotational alignments are locked-in or keyed with respect to the optical lens relative to the laser diode mounted on the TO-can. With these alignments mutually locked in this manner, it is preferable to lock the alignments such that the laser diode and lens share the same center x-y positioning as well as rotational alignment for best optical performance.

The z-distance between the TO-can and the lens, i.e., the linear distance which the light travels within the tube and through the lens, can be precisely set using a simple spacer element between the two parts during assembly and preferably fixed in place by glue, epoxy, solder, and/or mechanical means, and/or other coupling technique. In another embodiment, part of the TO-can extends along a z-axis (see FIG. 1 and FIG. 17) such that it mechanically establishes the predetermined distance between the mounted laser diode and the lens upon contact within the tube, e.g., heatsink, and extending along the z-axis of the assembly.

A further embodiment includes an intermediate spacer between the TO-can and the lens, where the spacer sets the distance between lens and TO-can. The spacer also sets the radial alignment between the lens and TO-can by having a geometry at each end that rotationally mates to each element of the lens and TO-can such that it locks rotational alignment between these two elements. It is preferable, that when the assembly is completed in the tube, the rotational alignment and x, y, and z-distance between lens and TO-can will be precisely aligned for best optical performance. Once the TO-can, spacer, lens and tube are in place, it is preferred that they be permanently bonded together using glue, epoxy, solder and/or mechanical means, and/or other coupling technique.

The non-circular tubular element may be preferentially fabricated using a low-cost extrusion process or casting process and be preferentially made of aluminum, steel, or copper to provide good thermal and mechanical performance. For improved radial and convection cooling, it is preferential for the tube to have radial fins that stretch outwards from the tube perimeter with a preferentially large surface area to further improve cooling.

As previously mentioned, this present concepts do not make use of a "bore," for example, as in U.S. Pat. No. 8,811,439 incorporated by reference above. One of ordinary skill in the art readily understands a bore to be clearly defined as a cylindrical internal hollow portion of a tube or member, which is universally made through machining in a rotary drill-like manner making the cylindrical hole. More importantly, the present concepts enable passive and precise radial and axial alignments of the TO-can with the lens without the need for precision fixtures and with few precision machining steps in making the optical elements.

In the above embodiment, only one precision material cutting operation is required, which is the machining of a slot relative to the interior tube notch geometry used for positioning the lens. In another preferred embodiment, this notch may be avoided by making use of a spacer which is geometrically keyed to an interior of the tube (or to the TO-can directly) and having surfaces on the lens-side of the tube which precisely mate to at least part of the surface of the lens such that the lens and spacer mate together and are radially oriented to the tube and/or TO-can. Thus, in one embodiment, the TO-can and spacer are both keyed to the interior of the tube, and the spacer is then keyed to the lens for precise radial and axial alignment of all elements. In another embodiment, the spacer keys the TO-can and lens directly to each other within the tube. The spacer is preferentially made of a low-cost formable material such as plastic. In such an embodiment where the spacer radially couples the lens directly to the TO-can, the tube element requires no precision machining, boring, or other material cutting steps. The complete assembly may be permanently secured using solder, epoxy, or glue, or other coupling technique. In another embodiment, this notch and the space may be avoided by using press-fit which mechanically pushes TO-can again the inside the tube whereby the TO-can is slightly larger than the inside diameter of the tube and after the press-fit is complete, the TO-can is fixed in position. In such an embodiment, a fixture is used to radially orient the tube and/or TO-can during the press-fit process.

In one aspect, provided is a system for providing passive alignment of a laser and a lens, comprising: a submount assembly; a laser diode coupled to the submount assembly; a mounting tube with an interior geometry that receives the submount assembly and mates with an exterior geometry of the submount assembly; and a lens coupled to one end of the mounting tube. The one end of the mounting tube is not radially symmetric such that the lens is coupled to the one end in one specific radial position. The submount assembly is mounted inside the mounting tube with mating geometries dictating a fixed rotational alignment between the lens and the mounting tube. One specific radial position of the lens at the one end of the mounting tube corresponds to the interior geometry of the mounting tube to establish how the submount assembly is radially fixed to the mounting tube, such that the lens is radially aligned with respect to both the submount and the laser diode to provide an optical alignment of the lens with respect to the laser diode.

In some embodiments, the one end of the mounting tube includes a groove at which the lens is mounted in the one specific radial position to align the lens with the laser diode.

In some embodiments, the system further comprises a mechanical spacer inside the mounting tube between the lens and the submount to precisely set a distance between the submount assembly and the lens.

In some embodiments, the system further comprises a press fit interface between a submount assembly and a mounting tube.

In some embodiments, the spacer includes one end having a geometry that mates with a geometry of the lens and fixes a rotational alignment of the lens, and the spacer includes an exterior geometry that is matched to the interior geometry of the mounting tube to provide a fixed rotational alignment.

In some embodiments, the system further comprises a plurality of lenses and spacers.

In some embodiments, the mounting tube is a heatsink having one or more mating keys and the submount includes a TO-can having one or more grooves constructed and arranged to align and mate with the mating keys of the heatsink.

In some embodiment, the TO-can and tube mating surfaces are press-fit together by press machine or other tools.

In some embodiment, an assembly fixture with radial alignments, such as bar, tube, pin and notch radially orients TO-can and/or tube. An assembly fixture with distance standoff sets a distance between the submount and lens In another aspect, provided is a system for providing passive alignment of a laser and a lens, comprising: a laser diode; a submount at which the laser diode is mounted; a lens; a mounting tube, the submount mounted inside the mounting tube; and a mechanical spacer in the mounting tube between the submount and the lens. The submount and mounting tube each has a mating geometry that establishes a locked alignment relative to a central axis extending through the center of the mounting tube in a direction of extension of the mounting tube. The mechanical spacer mates with the submount inside the mounting tube with a geometry that dictates only one fixed angle between the spacer and the submount. The opposite end of mechanical spacer mates with a lens geometry that dictates only one fixed angle between the lens and the mechanical spacer, such that the lens is radially to the submount and mounted laser diode, and aligned relative to the center of the mounting tube, and mechanically spaced to the submount and corresponding mounted laser diode to achieve a desired optical alignment of the lens to the laser diode.

In another aspect, provided is a system for providing passive alignment of lasers and lenses, the system comprising a laser diode; a submount for laser diode to be mounted on; a lens; a mounting tube; a mechanical spacer; wherein: the laser diode is mounted on the submount and the submount assembly is mounted inside the mounting tube with mating geometries dictating locked alignment relative to the center of the tube, the mechanical spacer mates with the submount inside the mounting tube with a geometry relative to the submount that dictates a fixed angle between the spacer and submount, and the opposite end of the mechanical spacer mates with the lens geometry that dictates only one fixed angle between lens and mechanical spacer, such that the lens is radially aligned to the spacer and aligned to at least one axis relative to the center of the tube, and mechanically spaced to the submount and corresponding mounted laser diode to achieve a desired optical alignment of the lens to the laser diode.

In some embodiments, the system further comprising one or more additional lenses and mechanical spacers where the spacer dictates only one fixed angle between additional lens and mechanical spacer on one end and the mechanical spacer the adjacent lens on the other end of the mechanical spacer, and corresponding mounted laser diode system achieves a desired optical alignment of the lenses to the laser diode.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the inventive concepts. Of the drawings:

FIG. 8 is an exploded view of a laser alignment assembly in accordance with some embodiments.

FIG. 9 is an exploded view of a laser alignment assembly in accordance with some embodiments.

FIG. 10 is a front perspective view of the laser alignment assembly of FIG. 9.

DETAILED DESCRIPTION OF EMBODIMENTS

Figure 1:
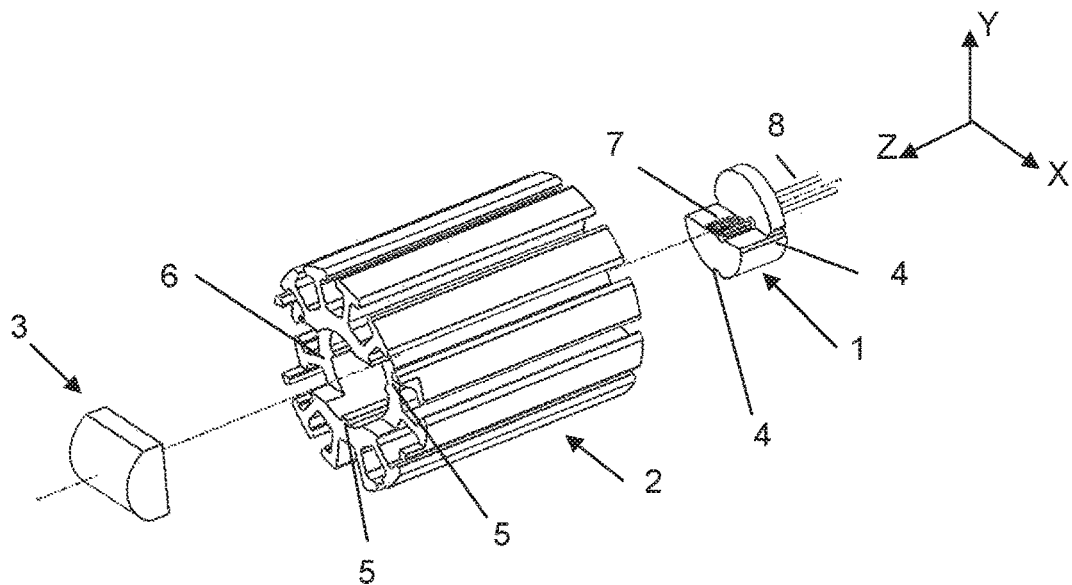
FIG. 1 is an exploded view of a laser alignment assembly in accordance with some embodiments.

In brief overview, one embodiment reveals a laser assembly that includes a laser diode chip mounted to a TO-can submount, or a portion of an optoelectronic apparatus at which a laser chip or the like is positioned, with an outside geometry that fits into a heatsink (or mounting tube) part. In particular, the interior of the heatsink geometry matches the outside of the TO-can and/or press fit with fixture key alignment such that both parts are radially locked in place and cannot rotate separate from each other, and one or more lenses fit into heatsink body such that they are rotationally fixed and the lens or lenses are ultimately lined up optically with the laser diode chip via both being fixed to a common heatsink element. The "heatsink" can be more generically called an optical assembly mount, or assembly tube (being non-circular, or circular—having not been bored out). In some embodiments, the heatsink or mounting tube does not conduct heat. This embodiment may set the distance the laser diode chip is positioned in the heatsink body using assembly fixtures prior to affixing by epoxy, glue, solder or press fit. The lens may be rotationally aligned to the heatsink body via a grove cut into the end of the heatsink or by having part of the lens engage with the inside or outside geometry of the heatsink so it is rotationally fixed to the heatsink. The lens distance into the heatsink may be set by having the lens hit an outside edge of the heatsink. The distance between the lens or lenses and the laser diode chip is therefore set by the geometry of the heatsink and how each part is set into the heatsink a fixed distance. Also, as described herein, the specific radial position of the lens at one end of the mounting tube corresponds to an interior geometry of the mounting tube to establish how the submount assembly is radially fixed to the mounting tube, such that the lens is radially aligned with respect to both the submount and the laser diode to achieve a good, adequate, or desired optical alignment of the lens to the laser diode chip. The heatsink part is preferentially made of a material with good thermal conduction and/or thermal capacity characteristics such that it is able to take heat away from the laser chip. The interface between the heatsink and the TO-can preferentially has a large surface area relative to the total surface of the TO-can. Preferentially greater than 20% of the surface area of the TO-can is in contact or extremely close proximity of the heatsink, or ideally greater than 30% of the surface area is in close proximity. Small gaps between the heatsink and TO-can surface are preferentially bridged using epoxy, glue, solder or similar liquid that subsequently hardens and forms a thermal bridge between the TO-can and heatsink.

In another embodiment, a spacer inside the heatsink directly abuts, or contacts, at least part of the TO-can and at least part of the lens to mechanically set the distance between the lens and TO-can during assembly. This spacer can preferentially have a mating surface to the inside the heatsink such that it is rotationally locked to the heatsink and the spacer also preferentially has a mechanical connection to the lens whereby the lens is rotationally locked to the spacer. This embodiment ties the rotational alignment and offset distance between the lens and the TO-can via the spacer and its connection with the heatsink as well as the TO-can's connection to the heatsink. This embodiment does not require precision assembly fixtures as all the parts are locked into each other both rotationally and in linear position without external tooling. Once fixture is assembled the parts should be fixed into place by epoxy, glue or solder. In some embodiments where multiple lenses are used, multiple spacers may be used to separate the distance between lenses inside the heatsink as well as between the TO-can and the lens adjacent to it in order to achieve a desired optical alignment of the lens to the laser diode.

FIG. 1 illustrates an exploded view of a laser alignment assembly including a submount including a TO-can 1, also referred to as a submount assembly, and a laser diode 7 constructed and arranged for positioning in and coupling an interior of the heatsink 2. The laser diode 7, also referred to as a laser diode chip, is mounted to the TO-can 1 either directly with glue, epoxy or solder, and optionally with an intermediate material submount made of ceramic or metal. One or more wire leads 8 may extend from the back of the laser diode 7, providing an electrical connection to the laser diode chip or related optical component. The TO-can 1 may include a plurality of grooves 4 or other outer geometry about an outer region of the TO-can 1 and extending in a same longitudinal direction (i.e., z-axis shown in FIG. 1) as the body of the TO-can 1. The grooves 4 of the TO-can 1 are constructed and arranged to mate with an inside geometry of a heatsink 2, for example, mating keys 5 or the like extending from a central lumen extending through the heatsink 2 along the z-axis such that TO-can 1 is rotationally interlocked to heatsink 2 when assembled together such that TO-can 1 cannot rotate independently inside heatsink 2. For example, a mounting tube with an interior geometry such as the heatsink 2 is constructed and arranged to the submount assembly including TO-can 1 and mates precisely with an outside geometry of the submount assembly. As shown in FIG. 1, TO-can 1 is also in a fixed position in an x-y spacing, in particular, an x-y plane of the Cartesian coordinates shown in FIG. 1, relative to the center of the interior of the heatsink 2. Heatsink 2 has a lens cutout 6 in one end that corresponds to the outer geometry of lens 3 such that lens 3 is rotationally locked to heatsink 2 once assembled together such that lens 3 aligns with TO-can 1. Cutout 6 also fixes one of the x-y spacing relative to the center of the interior of heatsink 2, for example, where the z-axis extends along a length of the heatsink 2 in the center of the hole of the heatsink 2. This end of the mounting tube of the heatsink 2 is not radially symmetric, for example, asymmetric or other difference, such that the lens 3 is positioned at this end including the cutout 6 in one specific radial position. In this embodiment, only one x-y dimension of the lens 3 is required to be fixed as the other direction is linearly symmetric. For example, regardless of the location of the surface of lens 3 along the x-axis shown in FIG. 1, the lens 3 can receive and direct a source of radiation, for example, light, in a consistent manner. The inside heatsink 2 has one or more mating keys 5 that mate with the outside geometry of TO-can 1 and its grooves 4, which do not allow for rotational movement between the TO-can 1 and heatsink 2 once assembled. An alternate embodiment includes mating keys on the TO-can 1 and mating grooves on the heatsink 2. Other embodiments may equally apply, for example, intervening coupling elements constructed and arranged to hold the TO-can 1 in place against the heatsink 2.

Figure 2A:
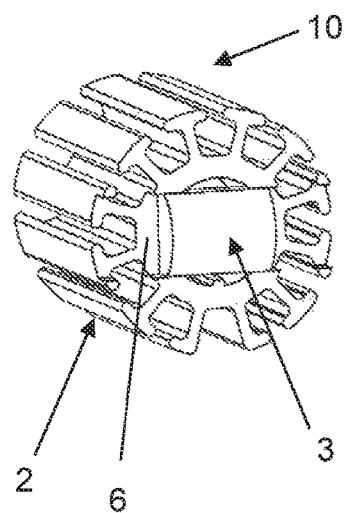
FIGS. 2A and 2B are front and rear isometric views, respectively, of the laser alignment assembly of FIG. 1 in a fully assembled state, in accordance with some embodiments.
Figure 2B:
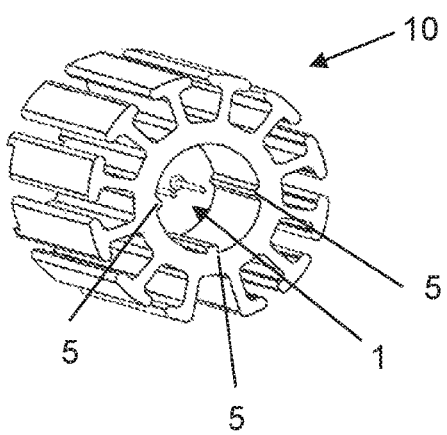

FIGS. 2A and 2B illustrates an assembly view of the laser alignment assembly of FIG. 1. Laser alignment assembly 10 is shown in both front (FIG. 2A) and rear (FIG. 2B) isometric views with lens 3 mounted on the front of heatsink 2 with assistance from lens cutout 6. TO-can 1 is mated into the back of heatsink 2 and radially fixed in position via keys 5 and mating grooves 4.

Figure 3:
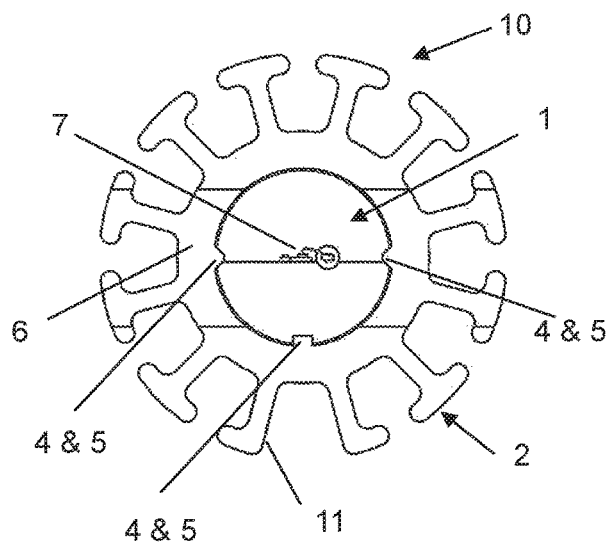
FIG. 3 is a front view of FIGS. 2A and 2B without the front lens and showing the internal assembly.

FIG. 3 illustrates a front view of laser alignment assembly 10 with lens 3 omitted so that internals of the mating between heatsink 2 and TO-can 1 are clearly visible and to further illustrate how the TO-can grooves 4 mate with heatsink keys 5 (preferably in multiple places) and how laser diode chip 7 is preferably positioned such that its laser emission area is at the center of the heatsink 2. Lens cutout 6 is also shown in the front view. The outer surface of heatsink 2 is shown with many T-shaped fins or the like which are preferable to dissipate heat generated from the laser diode chip 7 via convection to the surrounding air. Surface 11 shows one area of the geometry of heatsink 2 that is not the same as the rest of the radial features; this geometric exception can be used to positively lock the heatsink into assembly, testing, and machining fixtures such that fixtures will only accept the heatsink 2 with the correct orientation; this required orientation allows for automated alignment for cutting the lens cutout 6, assembly and testing where the heatsink 2 cannot be placed into an undesirable or wrong orientation.

Figure 4:
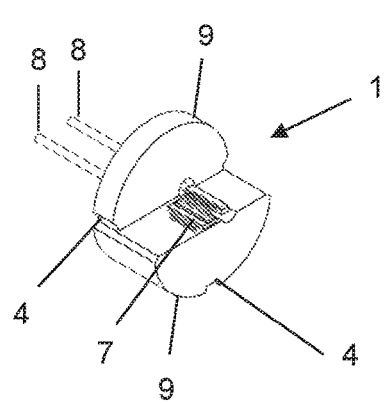
FIG. 4 is a front perspective view of a TO-can with a laser diode sub-assembly; in accordance with some embodiments.

FIG. 4 illustrates the TO-can 1 including grooves 4, laser diode chip 7, wire leads 8, and outside surface 9 which is preferably extruded or stamped in one continuous surface with no steps along the path except for one step which the laser diode chip 7 is mounted on. Preferably, surface 9 has a maximum surface area contact with heatsink 2 inside surface. It is preferable that surface 9 be mostly circular for ease of tooling, but is not limited to a circular shape. In other embodiments, the surface 9 can be in the shape of any geometry, such as square, triangle, diamond, star, or other shape so long as heatsink 2 has a mating inner geometry and at least one element of these geometries has mating elements such as grooves 4 and mating keys 5 so that both parts are rotationally locked to each other upon assembly, e.g., coupling of the TO-can 1 with heat sink 2.

Figure 5A:
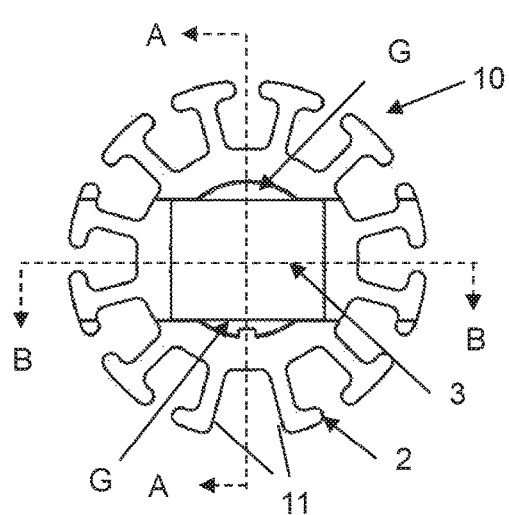
FIGS. 5A and 5B are front and rear views of the assembled laser alignment assembly of FIGS. 2A and 2B, respectively.
Figure 5B:
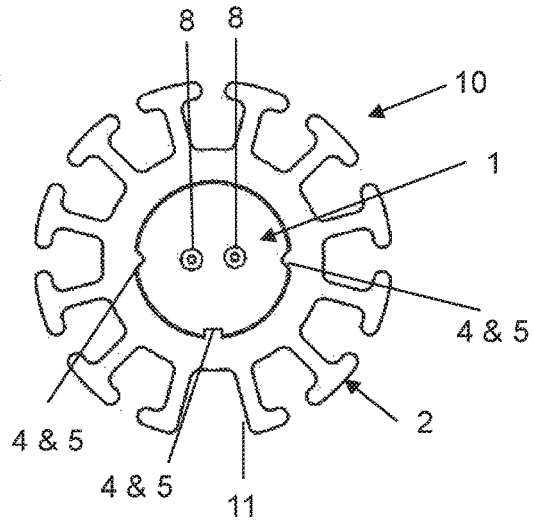

FIGS. 5A and 5B show front and rear views of laser alignment assembly 10. The rear view of FIG. 5B clearly shows the wire leads 8 and grooves 4 and mating keys 5. The front view of FIG. 5A shows a small gap (G) above and below the lens 3 as it mates with the heatsink 2. One or more gaps (G) can be provided intentionally to provide ventilation to the laser diode chip 7 shown in FIG. 4 and/or other electrical components of the TO-can 1, or it can be sealed with epoxy, glue or solder to protect the laser diode chip 7 from the environment. Preferably, the gap (G) is sealed with a larger lens, or otherwise filled so that there is no gap. Alternatively, the gap (G) is replaced with a different geometry of the heatsink 2 so there is no gap. It is preferable to seal laser diode chip 7 inside heatsink 2 in a hermetic fashion so that no air, moisture or debris enters the interior of the final assembly, since foreign matter or moisture may negatively impact the performance of laser diode chip 7 and/or related electronic components inside the heatsink 2.

Figure 6:
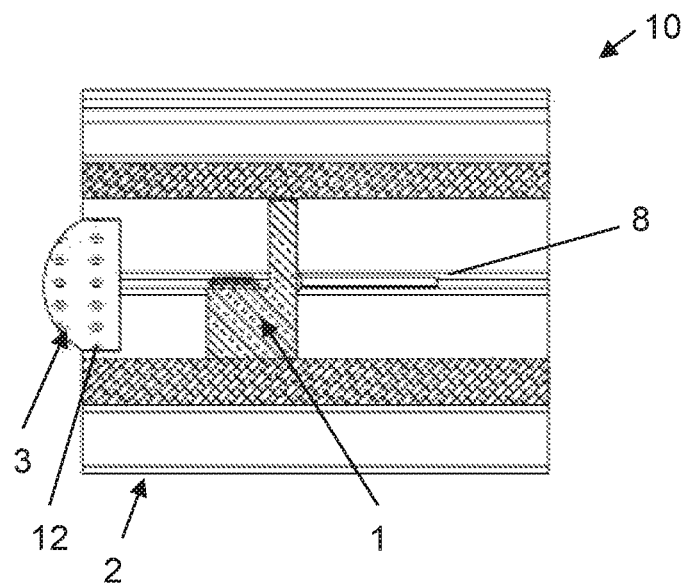
FIG. 6 is a cross-section view of the laser alignment assembly taken along line A-A of FIG. 5A where the cross-section plane is directly through the optical plane of the lens.

FIG. 6 illustrates a cross-section view of laser alignment assembly 10 taken along line A-A of FIG. 5A. This illustrates that TO-can 1 is a predetermined distance from the lens 3 but that this distance must be set upon assembly using a fixture because there is nothing preventing TO-can 1 from being closer or further from lens 3. Therefore, in some embodiments, lens 3 is affixed to one side of heatsink 2 by surface 12 which mates into lens cutout 6. Care must be taken to assemble TO-can 1 at the correct depth within heatsink 2 so the distance between lens 3 and TO-can 1 is acceptable for the optical performance of the system.

Figure 7:
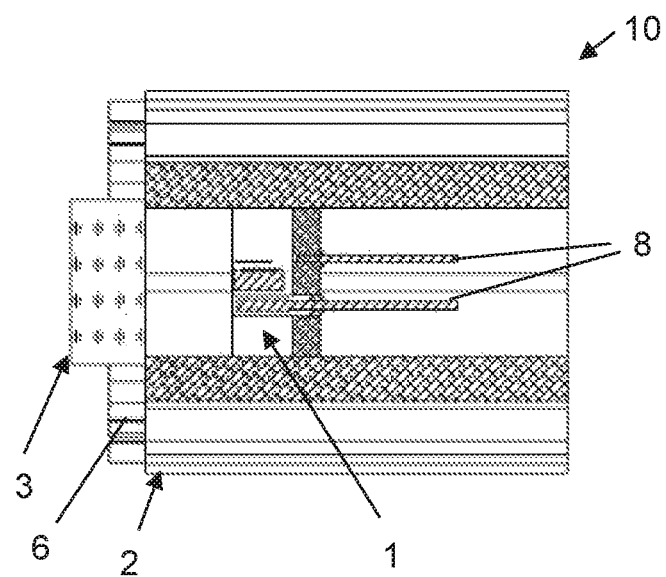
FIG. 7 is a cross-section of the laser alignment assembly taken along line B-B of FIG. 5A where the cross-section plane is directly through the side of the lens.
Figure 11:
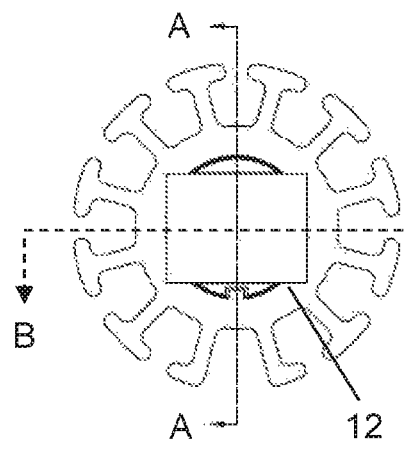
FIG. 11 is a front view of the laser alignment assembly of FIGS. 9 and 10.

FIG. 7 illustrates a cross-section view of a laser alignment assembly 10 but at 90-degrees through the lens 3 as compared to FIG. 6.

FIG. 8 illustrates an exploded view of a laser alignment assembly, in accordance with some embodiments. The similar to FIG. 1, except this embodiment includes the addition of a spacer 13. Spacer 13 provides a positive mechanical stop between lens 3 and TO-can 1 once the system is assembled. This approach removes the need for precision fixtures or procedures to position TO-can 1 within heatsink 2 to a set distance. Spacer 13 has geometry that establishes mechanical contact with TO-can 1 and lens 3 but preferably without blocking any significant amount of laser light going from the laser diodes chip 7 and/or other electronic components (mounted on TO-can 1) as it travels out into free space then and through lens 3.

FIG. 9 illustrates an exploded view of the laser alignment assembly similar to FIG. 8, but with the embodiment of spacer 13 geometry having a plurality of grooves 14 that extend in a same longitudinal direction as a length of the spacer 13, and mates with heatsink keys 5. In addition, the spacer 13 geometry has a set of tabs 15 that mate with the outside geometry of lens 3 providing a fixed rotational alignment between lens 3 and heatsink 2 as well as providing precise spacing distance between lens 3 and TO-can 1 via a mechanical stop in the geometry of spacer 13. Spacer 13 has a geometry that makes mechanical contact with TO-can 1 and lens 3 on either side thereof to set the z-axis spacing (along the path of laser light travel) between these parts, but preferably without blocking any significant amount of laser light going from laser diode chip 7 mounted on TO-can 1 as it travels out in free space and through lens 3. Spacer 13 has a geometry to precisely mate with lens 3 to provide precise rotational fixed position while also having a geometry that allows the lens-end of heatsink 2 to be sealed off once the assembly is completed and parts are affixed with epoxy, glue or solder. It is preferable to seal both ends of heatsink 2 from the outside environment so that dirt, dust, moisture or other contaminants do not affect the performance and operation of the laser diode chip 7 inside the heatsink 2. In other words, it is preferable in all embodiments to have the laser diode chip 7 sealed inside heatsink 2 such that no outside contaminants can affect the performance of the laser diode chip 7. Spacer 13 is preferably made out of a low-cost material such as plastic, aluminum, steel or copper, and preferentially manufactured by injection molding, stamping, or extrusion.

FIG. 10 illustrates the assembled laser alignment assembly of FIG. 9. As shown in FIG. 10, the tabs 15 of spacer 13 extend out from the spacer 13 and through the gap between lens 3 and the interior of heatsink 2. This embodiment does not require the machining of a lens cutout to align the lens 3 because the alignment is achieved at least in part by the configuration of the spacer 13, in particular, the presence of the tabs 15.

Figure 12:
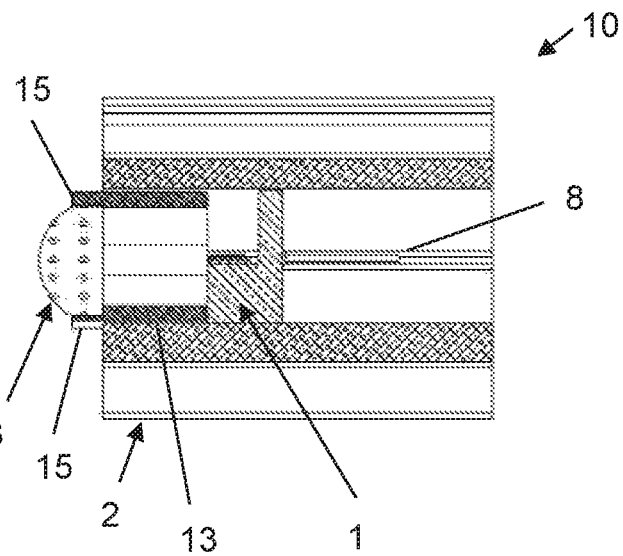
FIG. 12 is a cross-section of the laser alignment assembly taken along line A-A of FIG. 11.

FIG. 12 illustrates a cross-section view of laser alignment assembly 10 with spacer 13 including tabs 15 which rotationally orient lens 3 relative to heatsink 2, and spacer 13 setting a precise mechanical stop between TO-can 1 and lens 3.

Figure 13:
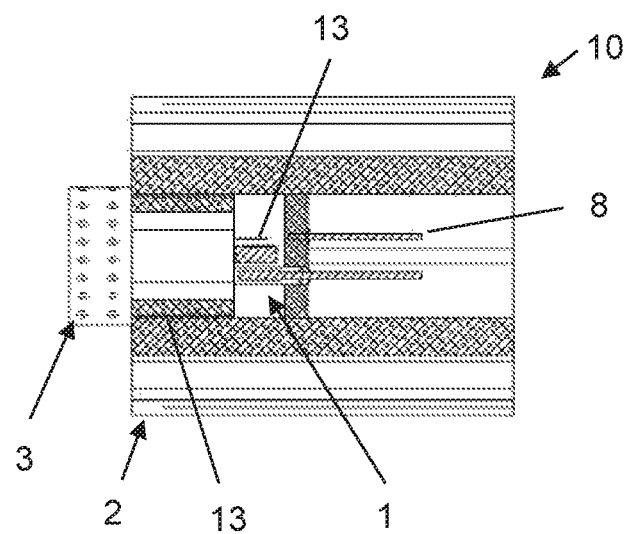
FIG. 13 is a cross-section of the laser alignment assembly taken along line B-B of FIG. 11.

FIG. 13 illustrates a cross-section view of laser alignment assembly 10 of FIGS. 9-12 but at 90-degrees through the lens as compared to FIG. 12.

Figure 14:
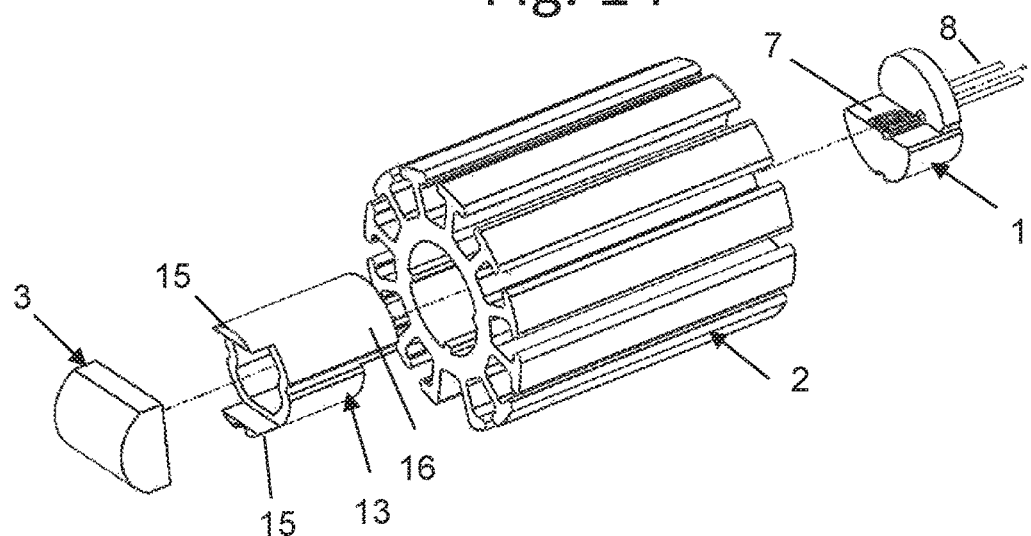
FIG. 14 is an exploded view of a laser alignment assembly in accordance with some embodiments.

FIG. 14 illustrates an exploded view of the laser alignment assembly similar to FIG. 9, but with the embodiment of a spacer 13 having a geometry that mates directly with TO-can 1 for rotational alignment via step extension 16 in addition to mating directly to lens 3 via tabs 15 on the opposite side. By mating the rotational alignment and spacer distance directly between TO-can 1 and lens 3 via spacer 13, it is not necessary to key any of these parts to heatsink 2. It may be preferable to key spacer 13 and TO-can 1 to heatsink 2 for ease of assembly (as shown in this embodiment), but the keying of these parts to heatsink 2 is not required in this embodiment. In another embodiment, lens 3, spacer 13 and TO-can 1 are not keyed to heatsink 2.

Figure 15:
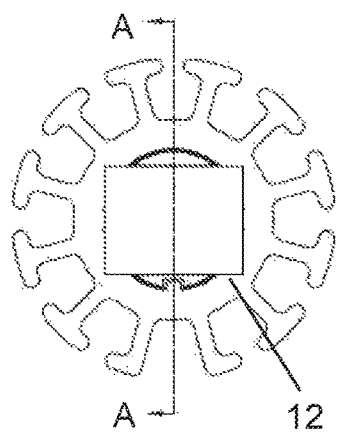
FIG. 15 is a front view of the laser alignment assembly of FIG. 14 when assembled.
Figure 16:
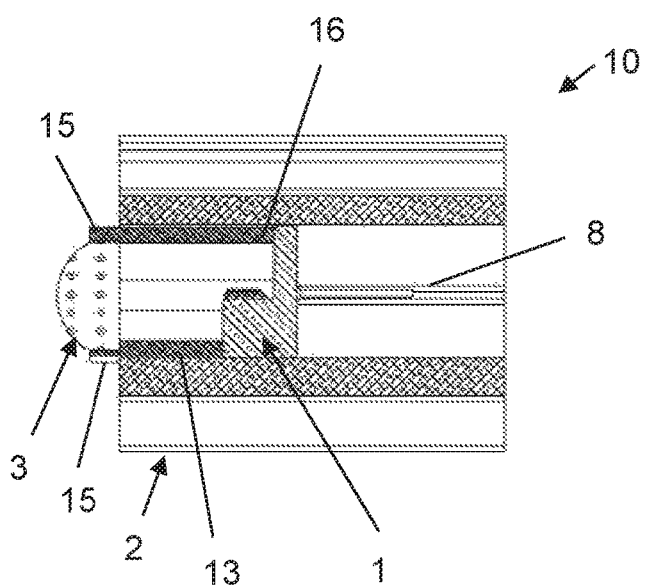
FIG. 16 is a cross-section of the laser alignment assembly taken along line A-A of FIG. 15.

FIG. 16 illustrates a cross-section view of laser alignment assembly 10 in FIG. 15, which in turn is a front view of assembly 10 in the exploded view illustrated in FIG. 14. Here, spacer 13 include tabs 15 which rotationally orient lens 3 relative to heatsink 2, and step extension 16 which extends to spacer 13 to mate and lock radial alignment, whereby the spacer 13 sets a precise mechanical stop between TO-can 1 and lens 3.

Figure 17:
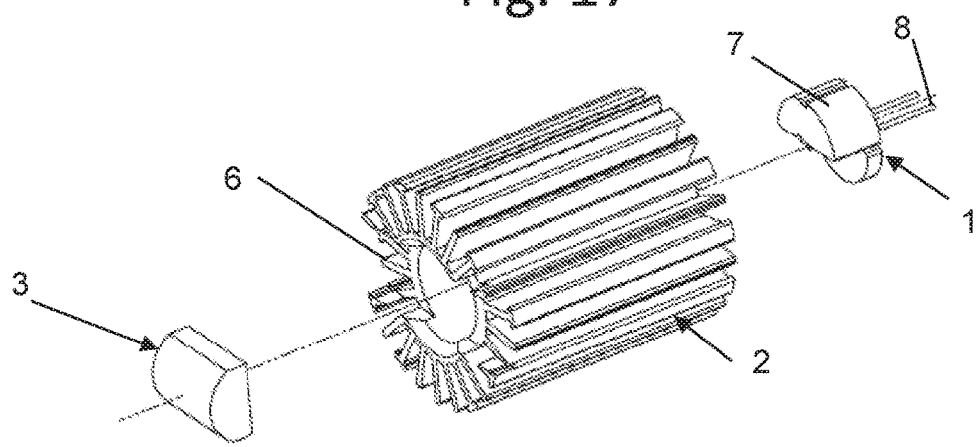
FIG. 17 is an exploded view of a laser alignment assembly in accordance with some embodiments.

FIG. 17 illustrates an exploded view of the laser alignment assembly similar to FIG. 1. However, instead the laser alignment assembly of FIG. 17, in some embodiments, is press fit interface between external surface of TO-can 1 and internal surface of heatsink 2. The TO-can 1 exterior is slightly larger than heatsink interior which allows two surfaces to interface each other tightly. With further regard to FIG. 17, heatsink 2 has an optional lens cutout 6 in one end that corresponds to the outer geometry of lens 3 such that lens 3 is rotationally locked to heatsink 2 once assembled together such that lens 3 aligns with TO-can 1. Following the same Cartesian coordinates as FIG. 1, the x-y rotation of TO-can 1 and Z distance between TO-can 1 and lens 3 are predetermined by an assembly fixture of FIG. 20. In a similar embodiment, if the heatsink 2 does not have lens slot 6, then the rotational of the lens to the heatsink is defined by its alignment in the fixture during assembly and thereby provide appropriate alignment between the TO-can and laser chip to the lens.

Figure 18:
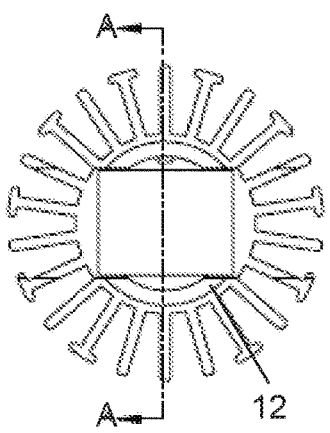
FIG. 18 is a front view of the assembled laser alignment assembly of FIG. 17 in accordance with some embodiments.
Figure 19:
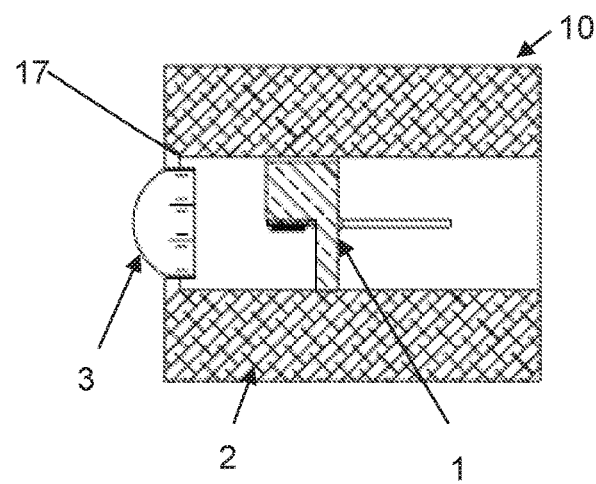
FIG. 19 is a cross-section view of the laser alignment assembly taken along line A-A of FIG. 18 where the cross-section plane is directly through the optical plane of the lens.

FIG. 19 illustrates a cross-section view of laser alignment assembly 10 in FIG. 18, which in turn is a front view of assembly 10 in the exploded view illustrated in FIG. 17. A chamfer 17 of heatsink 2 guides TO-can 1 sliders into heatsink 2 without tilt.

Figure 20:
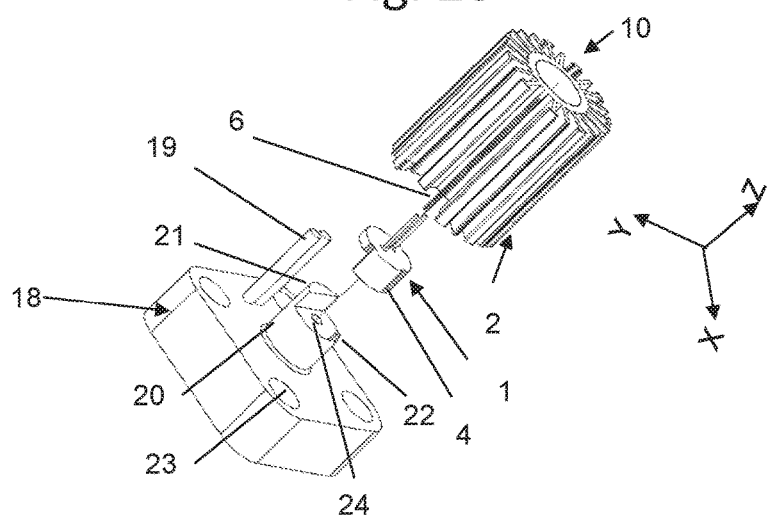
FIG. 20 is an exploded view of a fixture and a laser alignment assembly in accordance with some embodiments.

FIG. 20 is an exploded view of a fixture 18 and a laser alignment assembly 10 in accordance with some embodiments. TO-can 1 is positioned onto fixture 18 with tab 22 inserting into groove 4. The tab 22 rotationally orients TO-can 1. TO-can 1 faces down to cylinder support 20 with the auxiliary support 21 against eyelet of TO-can 1 to keep it even. The middle hole 24 is constructed and arranged to avoid chip contact with the fixture and possible chip damage during a press-fitting operation, for example, described in FIG. 17 where a press-fit interface is between the submount assembly 1 and the mounting tube. The heatsink 2 is mounted with upside down, the two pins 19 are used to guide the heatsink without rotation and align the heatsink along unique radial position. Heatsink 2 has two unique mating grooves to mate these two pins 19 at only one rotational position. The heatsink 2 is press fit with downward force onto the TO-can 1 which is mounted into fixture 18. The rotational angle between lens cutout 6 and TO-can 1 is predetermined by support 20. The TO-can 1 and heatsink 2 are tightly bonded together because the press fit design and do not move relative to one another after the press-fit operation is completed.

Figure 21:
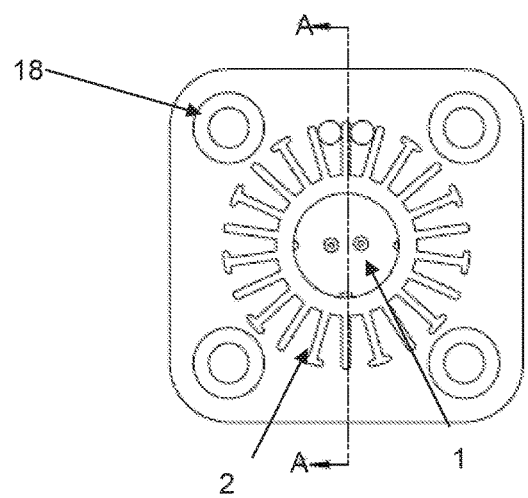
FIG. 21 is a top view of a fixture and a laser alignment assembly of FIG. 20 in accordance with some embodiments.
Figure 22:
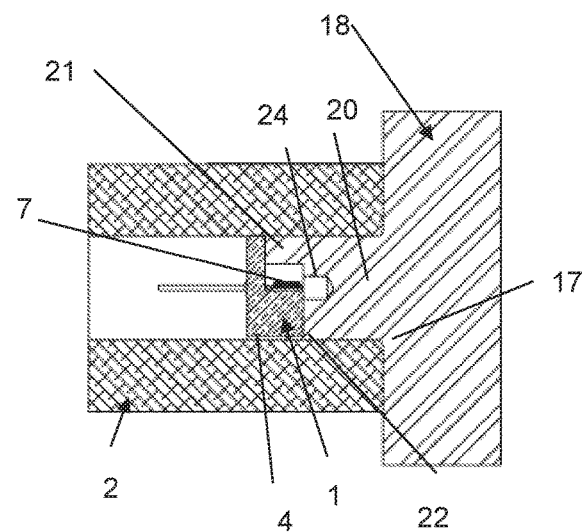
FIG. 22 is a cross-section view of a fixture and a laser alignment assembly taken along line A-A of FIG. 21

FIG. 22 illustrates a cross-section view of fixture 18 and a laser alignment assembly 10 at completed post-press-fit stage of assembly. FIG. 21 shows this same stage from a top-view perspective. Heatsink 2 press fits the TO-can 1 all the way to the end whereby heatsink 2 stops when it contacts the base of fixture 18. The distance of TO-can 1 is fixed by support 20 and auxiliary support 21. The rotation of TO-can 1 is registered by tab 22 on the fixture 18. The hole 24 is provided to protect laser diode chip 7. The chamfer 17 on the heatsink 2 guides the heatsink 2 to TO-can 1 at initial press stage so it centers TO-can 1 with heatsink 2 during this operation.

What is claimed is:

1. A system for providing passive alignment of a laser and a lens, comprising:
    a submount assembly;
    a laser diode coupled to the submount assembly;
    a mounting tube with a mating key geometry or geometries that extend along a length of an interior of the mounting tube and receive the submount assembly and mates with a mating groove geometry or geometries of the submount assembly; and
    a lens coupled to one end of the mounting tube, wherein:
        the one end of the mounting tube is not radially symmetric such that the lens is coupled to the one end in one specific radial position, wherein the one end of the mounting tube has an outermost exterior surface that includes a lens cutout that extends from one side of the exterior geometry to another side of the exterior geometry and that corresponds to a geometry of the lens so that the lens is rotationally locked to the mounting tube in the one specific radial position to align the lens with the laser diode,
        the submount assembly is mounted inside the mounting tube with mating geometries dictating a fixed rotational alignment between the lens and the mounting tube, and
        the one specific radial position of the lens at the one end of the mounting tube corresponds to the interior geometry of the mounting tube to establish how the submount assembly is radially fixed to the mounting tube, such that the lens is radially aligned with respect to both the submount and the laser diode to provide an optical alignment of the lens with respect to the laser diode.

2. The system of claim 1, further comprising a mechanical spacer inside the mounting tube between the lens and the submount to precisely set a distance between the submount and the lens.

3. The system of claim 2, wherein the spacer includes one end having a geometry that mates with a geometry of the lens and fixes a rotational alignment of the lens, and wherein the spacer includes an exterior geometry that is matched to the interior geometry of the mounting tube to provide a fixed rotational alignment.

4. The system of claim 3, further comprising a plurality of lenses and spacers.

5. The system of claim 3, wherein the mounting tube is a heatsink having the one or more mating keys and the submount includes a TO-can having the one or more grooves constructed and arranged to align and mate with the mating keys of the heatsink.

6. The system of claim 1, further comprising a press-fit interface between the submount assembly and the mounting tube.

7. A system for providing passive alignment of a laser and a lens, comprising:
    a laser diode;
    a submount at which the laser diode is mounted;
    a lens;
    a mounting tube, the submount mounted inside the mounting tube; and
    a mechanical spacer in the mounting tube that provides a mechanical stop between the submount and the lens;
    wherein:
        the submount having a mating groove geometry or geometries and mounting tube has a mating key geometry or geometries that extend along a length of an interior of the mounting tube and that establish a locked alignment relative to a central axis extending through the center of the mounting tube in a direction of extension of the mounting tube,
        one end of the mechanical spacer mates with the submount inside the mounting tube with a geometry that dictates only one fixed radial angle between the spacer and the submount, and
        the opposite end of mechanical spacer mates with a lens geometry that dictates only one fixed radial angle between the lens and the mechanical spacer, such that the lens is radially aligned to the submount and mounted laser diode, and aligned relative to the center of the mounting tube, and mechanically spaced to the submount and corresponding mounted laser diode to achieve a desired optical alignment of the lens to the laser diode.

8. A system of claim 7, further comprising one or more additional lenses and mechanical spacers where the spacer dictates only one fixed angle between additional lens and mechanical spacer on one end and the mechanical spacer the adjacent lens on the other end of the mechanical spacer, and corresponding mounted laser diode system achieves a desired optical alignment of the lenses to the laser diode.

9. A system for providing passive alignment of lasers and lenses, the system comprising:
    a laser diode;
    a submount for laser diode to be mounted on;
    a lens;
    a mounting tube;
    a mechanical spacer; wherein:
        the laser diode is mounted on the submount and the submount is mounted inside the mounting tube with mating geometries dictating a locked alignment relative to the center of the tube, the mating geometries including the mounting tube having a mating key geometry or geometries that extend along a length of an interior of the mounting tube and the submount having a mating groove geometry or geometries that mate with the mating key geometry or geometries of the mounting tube,
        the mechanical spacer mates with the submount inside the mounting tube with a geometry relative to the submount that dictates a fixed angle between the spacer and submount, and
        the opposite end of the mechanical spacer mates with the lens geometry that dictates only one fixed radial angle between lens and mechanical spacer, such that the lens is radially aligned to the spacer and aligned to at least one axis relative to the center of the tube, and mechanically spaced to the submount and corresponding mounted laser diode to achieve a desired optical alignment of the lens to the laser diode.

10. A system for providing passive alignment of a laser and a lens, comprising:
   a submount assembly;
   a laser diode coupled to the submount assembly;
   a mounting tube with a smaller interior than submount assembly exterior and press fit an exterior surface of the submount assembly into smaller tube assembly; and
   a lens coupled to one end of the mounting tube, wherein:
     the submount assembly is mounted inside the mounting tube such that rotational alignment between the TO-can and the mounting tube are fixed at a desired position, and
     the lens is further mounted at one end of the mounting tube corresponds to the interior geometry of the mounting tube and TO-can radial alignment to establish how the submount assembly is radially fixed to the mounting tube, such that the lens is radially aligned with respect to both the submount and the laser diode to provide an optical alignment of the lens with respect to the laser diode, wherein the one end of the mounting tube has an outermost exterior surface that includes a lens cutout that extends from one side of the exterior geometry to another side of the exterior geometry and that corresponds to a geometry of the lens so that the lens is rotationally locked to the mounting tube in the one specific radial position to align the lens with the laser diode.

\* \* \* \* \*